(12) United States Patent
Yueh et al.

(10) Patent No.: US 12,111,531 B2
(45) Date of Patent: Oct. 8, 2024

(54) ELECTRONIC DEVICE

(71) Applicant: InnoLux Corporation, Miao-Li County (TW)

(72) Inventors: Jui-Jen Yueh, Miao-Li County (TW); Kuan-Feng Lee, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/096,546

(22) Filed: Jan. 12, 2023

(65) Prior Publication Data

US 2023/0296936 A1   Sep. 21, 2023

(30) Foreign Application Priority Data

Feb. 28, 2022   (CN) .......................... 202210187738.8

(51) Int. Cl.
    *G02F 1/1335* (2006.01)
    *H10K 50/86* (2023.01)
(52) U.S. Cl.
    CPC ..... *G02F 1/133512* (2013.01); *H10K 50/865* (2023.02)

(58) Field of Classification Search
None
See application file for complete search history.

(56) References Cited

U.S. PATENT DOCUMENTS

| | | | |
|---|---|---|---|
| 9,857,620 B2 | 1/2018 | Chen | |
| 2015/0060827 A1* | 3/2015 | Sasaki | H10K 59/8792 257/40 |
| 2017/0315405 A1* | 11/2017 | Masuda | C09K 11/77348 |
| 2021/0202918 A1* | 7/2021 | Hong | G02F 1/133514 |
| 2022/0285655 A1* | 9/2022 | Lee | H10K 59/38 |
| 2023/0017110 A1* | 1/2023 | Adachi | G02F 1/133502 |

* cited by examiner

*Primary Examiner* — Shan Liu
(74) *Attorney, Agent, or Firm* — Winston Hsu

(57) ABSTRACT

An electronic device is disclosed by this disclosure. The electronic device includes a pixel substrate and a first light blocking structure. The pixel substrate includes a first pixel. The first light blocking structure is disposed on the pixel substrate, and the first light blocking structure includes a first unit and a second unit. In a top view direction of the electronic device, the first unit and the second unit are separated from each other in a first direction by a first pitch, and the first pixel has an exposed part between the first unit and the second unit. The exposed part has a first length in the first direction, a first ratio is a ratio of the first length to the first pitch, and the first ratio is greater than or equal to 0.4 and less than or equal to 0.85.

12 Claims, 7 Drawing Sheets

ELECTRONIC DEVICE

BACKGROUND OF THE DISCLOSURE

1. Field of the Disclosure

The present disclosure relates to an electronic device, and particularly to an electronic device including a light blocking structure.

2. Description of the Prior Art

With continuous improvement of functions, electronic devices fulfill various needs of users and become necessary tools in people's lives. For example, mobile phones, televisions, monitors, tablet PCs, and desktop PCs may be used as electronic devices with a displaying function. However, in different operation scenarios, the display performance requirements of the electronic device are also different. For example, the car display may cause reflections on the windshield of the car, which may cause interference in the driving line of sight and related safety issues, so that the installation position of the car display is limited and/or an additional mask has to be attached to the outer part of the car display to improve the problems described above.

SUMMARY OF THE DISCLOSURE

It is one of the objectives of the present disclosure to provide an electronic device. A light blocking structure is disposed on a pixel substrate, and a relative relationship between a length of an exposed part of a pixel and an arrangement pitch of the corresponding light blocking structure may be controlled for lowering the display brightness at large angles and meeting specific product requirements.

An electronic device is provided in this disclosure. The electronic device includes a pixel substrate and a first light blocking structure. The pixel substrate includes a first pixel. The first light blocking structure is disposed on the pixel substrate, and the first light blocking structure includes a first unit and a second unit. In a top view direction of the electronic device, the first unit and the second unit are separated from each other in a first direction by a first pitch, the first pixel has an exposed part between the first unit and the second unit, the exposed part has a first length in the first direction, a first ratio is a ratio of the first length to the first pitch, and the first ratio is greater than or equal to 0.4 and less than or equal to 0.85.

These and other objectives of the present disclosure will no doubt become obvious to those of ordinary skill in the art after reading the following detailed description of the embodiment that is illustrated in the various figures and drawings.

DETAILED DESCRIPTION

Figure 1:
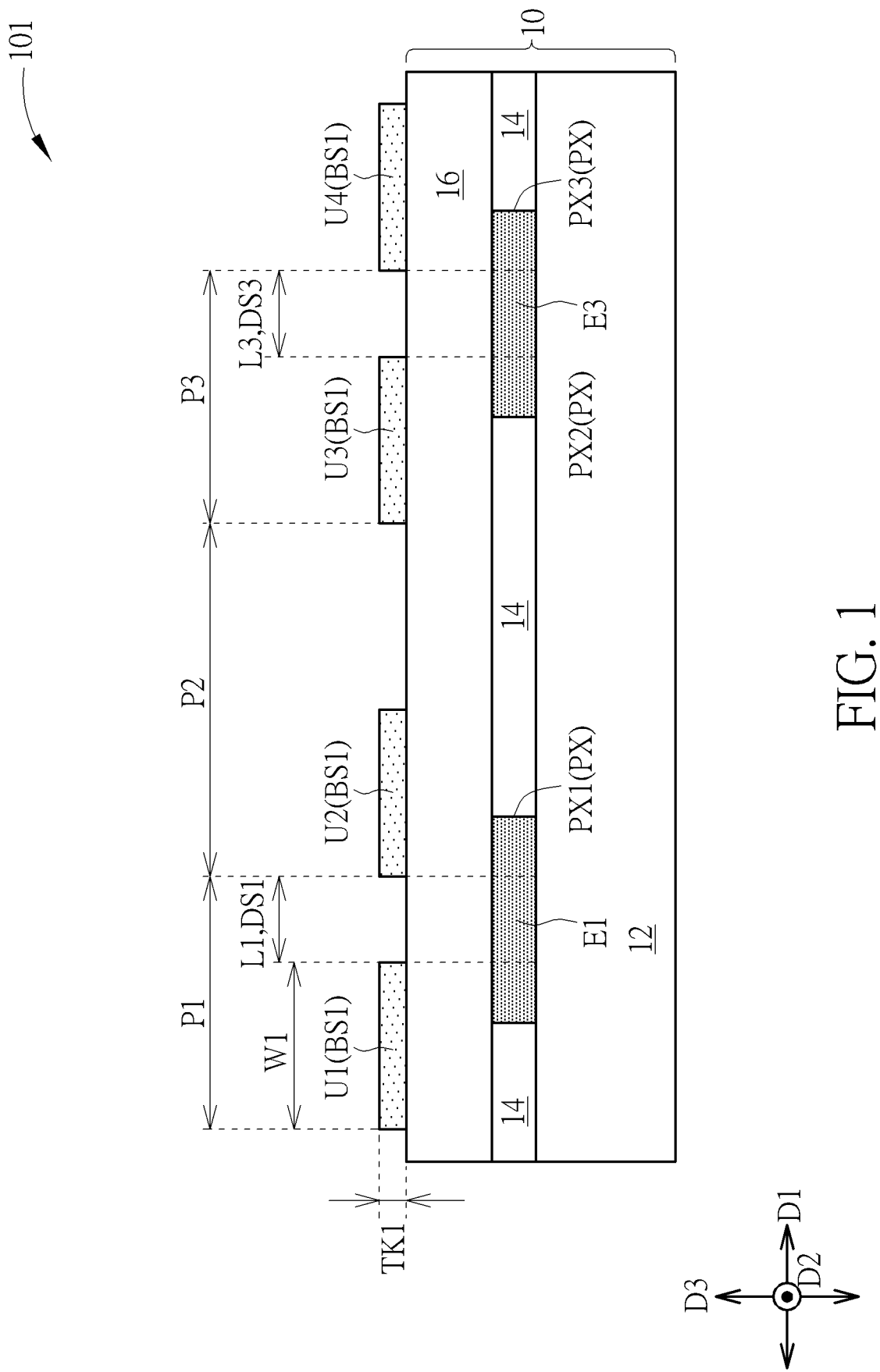
FIG. 1 is a schematic diagram illustrating a partial structure of an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name. Thus, a first element mentioned in the specification may be called a second element.

Spatially relative terms, such as "above", "on", "beneath", "below", "under", "left", "right", "before", "front", "after", "behind" and the like, used in the following embodiments just refer to the directions in the drawings and are not intended to limit the present disclosure. It may be understood that the elements in the drawings may be disposed in any kind of formation known by those skilled in the related art to describe or illustrate the elements in a certain way. Furthermore, when one element is mentioned to overlap another element, it may be understood that the element may partially or completely overlap the another element.

In addition, when one element or layer is "on" or "above" another element or layer, it may be understood that the element or layer is directly on the another element or layer, and alternatively, another element or layer may be between the one element or layer and the another element or layer (indirectly). On the contrary, when the element or layer is "directly on" the another element or layer, there is no intervening element or layer between the element or layer and the another element or layer.

It should be understood that when a component or a layer is referred to as being "connected to" another component or layer, it may be directly connected to the another component or layer, or intervening components or layers may be located between the two components or layers. When a component is referred to as being "directly connected to" another component or layer, there may be not any intervening components or layers between the two components or layers. As disclosed herein, when one element is referred to as being "electrically connected to" or "coupled to" another element, it will be understood that intervening elements may be between the element and the another element and electrically connect the element to the another element, and alternatively, the element may be directly electrically connected to the another element without intervening elements existing between them. If one element is referred to as being "directly electrically connected to" or "directly coupled to" another element, there are no intervening elements present between them.

As disclosed herein, the terms "approximately", "essentially", "about", "substantially", and "same" generally mean within 20%, 10%, 5%, 3%, 2%, 1%, or 0.5% of the reported numerical value or range. The quantity disclosed herein is an approximate quantity, that is, without a specific description of "approximately", "essentially", "about", "substantially", and "same", the quantity may still include the meaning of "approximately", "essentially", "about", "substantially", and "same".

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness and width may be measured by using an optical microscope (OM), an electron microscope or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

In the present disclosure, the electronic device may have a displaying function and may optionally include optical sensing, image detecting, touching sensing or antenna function, other suitable functions or any combination thereof, but not limited thereto. In other words, the electronic device may include a display device, a backlight device, an antenna device, a sensing device, or a spliced device, but not limited thereto. The electronic device may be a foldable electronic device or a flexible electronic device. The display device may be a non-self-luminous display device or a self-luminous display device. The antenna device may be a liquid crystal antenna device or a non-liquid crystal antenna device, and the sensing device may be a sensing device for sensing capacitance, light, heat, or ultrasound, but not limited thereto. The electronic unit may include an active unit and a passive unit, such as a capacitor, a resistor, an inductor, a diode, a transistor, and so on. The diode may include a light emitting diode or a photodiode. The light emitting diode may for example include organic light emitting diode (OLED), mini light emitting diode (mini-LED), micro light emitting diode (micro-LED), or quantum dot light emitting diode (quantum dot LED), but not limited thereto. The spliced device may be a spliced display device or a spliced antenna device, but not limited thereto. In addition, the electronic device may be a color display device, a single color display device or a grayscale display device, for example. The shape of the electronic device may be a rectangle, a circle, a polygon, a shape with a curved edge, curved, or other suitable shapes, for instance. The electronic device may optionally have peripheral systems such as a driving system, a control system, a light source system, etc. It should be noted that, the electronic device may be any arrangement and combination of the foregoing, but not limited thereto. Hereinafter, the present disclosure will be described by taking the display device as the electronic device or the spliced device, but the present disclosure is not limited to this.

Figure 2:
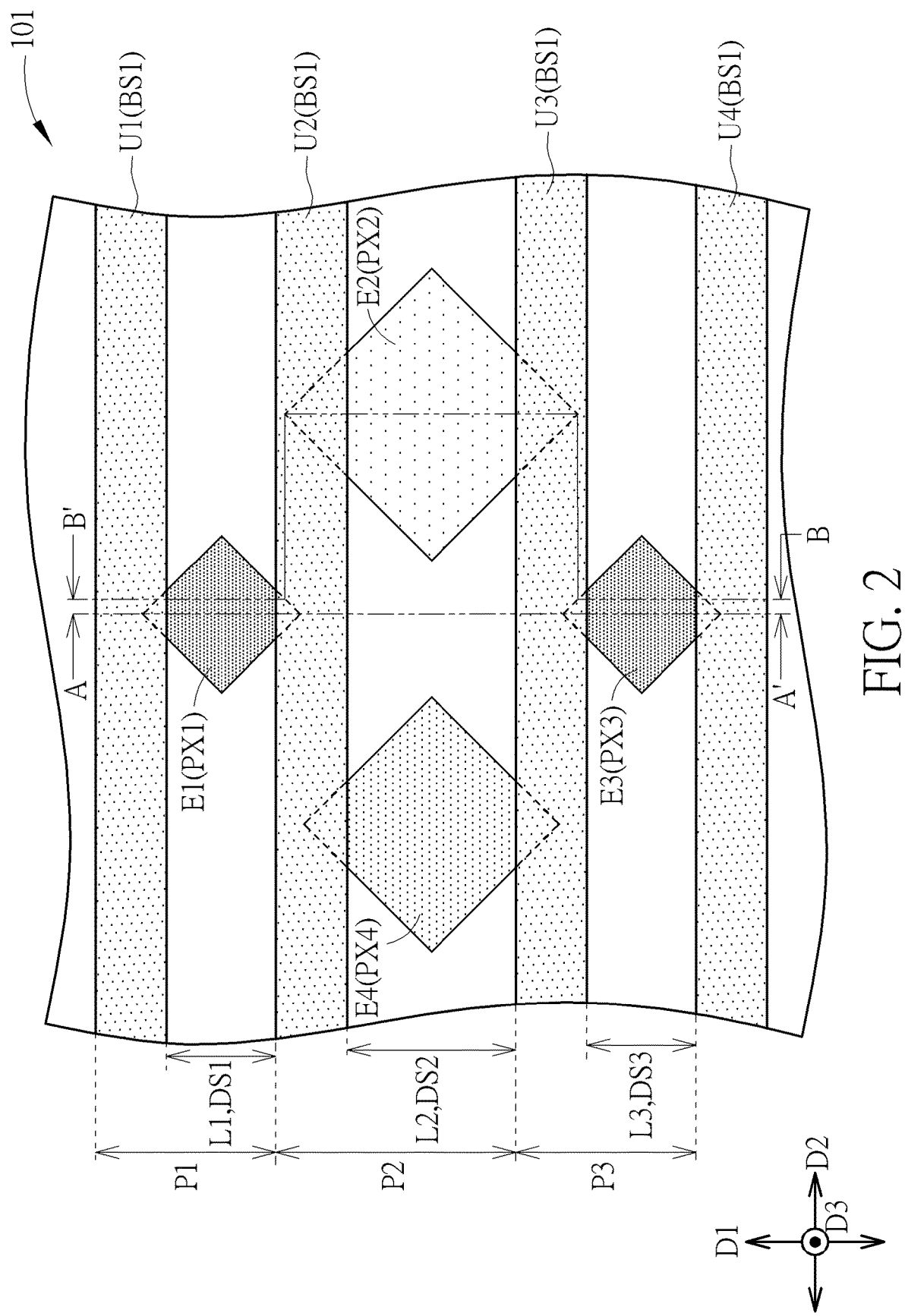
FIG. 2 is a schematic diagram illustrating a partial top view structure of the electronic device according to the first embodiment of the present disclosure.

Please refer to FIG. 1 and FIG. 2. FIG. 1 is a schematic diagram illustrating a partial structure of an electronic device 101 according to a first embodiment of the present disclosure, and FIG. 2 is a schematic diagram illustrating a partial top view structure of the electronic device 101. In some embodiments, FIG. 1 is a cross-sectional diagram of the electronic device taken along a line A-A' in FIG. 2, but not limited thereto. As shown in FIG. 1 and FIG. 2, the electronic device 101 includes a pixel substrate 10 and a first light blocking structure BS1. The pixel substrate 10 includes a first pixel PX1. The first light blocking structure BS1 is disposed on the pixel substrate 10, and the first light blocking structure BS1 includes a first unit U1 and a second unit U2. In a top view diagram of the electronic device 101 (such as FIG. 2) and/or in a top view direction of the electronic device 101 (such as a direction viewing FIG. 2, that is, a third direction D3), the first unit U1 and the second unit U2 are separated from each other in a first direction D1 by a first pitch P1, the first pixel PX1 has an exposed part E1 located between the first unit U1 and the second unit U2, the exposed part E1 has a first length L1 in the first direction D1, a first ratio (for example, R1 may be used to represent the first ratio) is a ratio of the first length L1 to the first pitch P1 (such as L1/P1), and the first ratio is greater than or equal to 0.4 and less than or equal to 0.85 (for example, it may be represented by 0.4≤R1≤0.85). By disposing the first light blocking structure BS1 on the pixel substrate 10 and controlling the relative relationship between the length of the exposed part of the pixel in the pixel substrate 10 and the arrangement pitch of the corresponding first light blocking structure BS1 (such as the first ratio described above), the display brightness of the electronic device 101 at large angles may be lowered for meeting specific product requirements. For example, when the electronic device 101 is applied to a car display device, the display brightness at large angles may be lowered for improving reflections on the windshield of the car by the electronic device 101 and reducing the chance of problems arising from this. For instance, the driver visibility may be improved and/or issues affecting driving safety may be reduced for meeting product requirements for specific applications Specifically, in some embodiments, the pixel substrate 10 may include a substrate 12 and a plurality of pixels PX, and the plurality of pixels PX are disposed on the substrate 12. The substrate 12 may include at least one of a rigid substrate or a flexible substrate, a mixture of the material described above, other suitable materials, or a combination of the materials described above, but not limited thereto. The material of the rigid substrate may include glass, quartz, ceramic, sapphire, at least one of the materials described above, mixtures of the materials described above, other suitable materials, or a combination of the materials described above, but not limited thereto. The material of the flexible substrate may include rubber, polymer material, such as polyimide (PI), polyethylene naphthalate (PEN), polycarbonate (PC), polyurethane, polydimethylenesiloxane and/or polyethylene terephthalate (PET), at least one of the materials described above, mixtures of the materials described above, other suitable materials, or a combination of the materials described above, but not limited thereto. In some embodiments, each of the pixels PX may be a subpixel generating light, such as the first pixel PX1, a second pixel PX2, a third pixel PX3, and/or a fourth pixel for providing a single color respectively For instance, the first pixel PX1 may generate green light, the second pixel PX2 may generate blue light, the third pixel PX3 may generate green light, and the fourth pixel PX4 may generate red light, but not limited thereto. In some embodiments, the pixels PX may be disposed on the substrate 12 and arranged in an array configuration, driving circuits, such as transistor structures (not illustrated), may be disposed on the substrate 12 and disposed corresponding to the pixels PX, the transistor structures may be disposed and arranged in an array configuration also, and the substrate 12 may include an array substrate accordingly, but not limited thereto. In addition, the method for defining each pixel PX may vary depending on the corresponding display technology. For example, when the electronic device 101 include a liquid crystal display device and/or when the electronic device 101 is a liquid crystal display device, each of the pixels PX may include a liquid crystal display pixel unit, and the shape, area, and other conditions of each pixel PX in the top view may be defined by the corresponding pixel electrode in the liquid crystal display pixel unit. When the electronic device 101 includes and/or is an organic light emitting diode display device, a mini light emitting diode display device, or a micro light emitting diode display device, each of the pixels PX may include an organic light emitting diode, a mini light emitting diode, or a micro light emitting diode, and the shape, area, and other conditions of each pixel PX in the top view may be defined by the opening of the pixel defining layer (PDL). When the pixel PX include an organic light emitting diode, each pixel PX may include an anode, a light emitting material layer, and a cathode located in and located corresponding to the opening of the pixel defining layer. When the electronic device 101 includes and/or is a light emitting diode (LED) display device, a mini light emitting diode display device without the pixel defining layer, or a micro light emitting diode display device without the pixel defining layer, the shape, area, and other conditions of each pixel PX in the top view may be defined by the light emitting surface of the corresponding light emitting diode.

In some embodiments, the material of the first light blocking structure BS1 may include light absorbing materials or materials that do not transmit light easily (materials with higher optical density, such as a material with optical density higher than or equal to 1.5), such as black materials (such as a black resin or a resin doped with black pigment and/or black particles), dark materials, metal, other suitable materials, or a combination of the materials described above, but not limited thereto. In some embodiments, the first light blocking structure BS1 may include a plurality of units made of the materials described above (such as the first unit U1 and the second unit U2 described above). In some embodiments, the first unit U1 and the second unit U2 of the first light blocking structure BS1 may extend in a second direction D2 respectively, wherein the second direction D2 is different from the first direction D1. For instance, the second direction D2 may be substantially orthogonal to the first direction D1, but not limited thereto. In addition, the pitch used herein may be taken as the distance between the same sides of two objects in a particular direction wherein the two objects are arranged in that direction. For example, the first pitch P1 may be equal to a distance between the left edge of the first unit U1 and the left edge of the second unit U2 in the first direction D1 as illustrated in FIG. 1. In some embodiments, the first unit U1 and the second unit U2 may have substantially the same width (such as a width W1 illustrated in FIG. 1), and the first pitch P1 may be equal to the sum of the width W1 and the distance DS1 between the first unit U1 and the second unit U2 in the first direction D1, but not limited thereto. In addition, the width W1 may be used as a length of the first unit U1 in the first direction D1 also.

In some embodiments, the pixel substrate 10 may further include a material layer 14 and an insulating layer 16. The insulating layer 16 may be disposed on each pixel PX, and the material layer 14 may be located between the insulating layer 16 and the substrate 12 in the third direction D3. In some embodiments, the insulating layer 16 may include a single insulating material layer or a structure of staked insulating material layers. The insulating materials may include inorganic insulating materials or organic insulating materials. The inorganic insulating materials may include silicon oxide, silicon nitride, aluminum oxide, or other suitable insulating materials, for example. The organic insulating materials may include acrylic resin or other suitable insulating materials, for example. When the insulating layer 16 is a structure of stacked insulating material layers, any arrangement and combination of the aforementioned insulating materials may be applied, such as a multi-layer structure formed by alternately stacking inorganic insulating materials and organic insulating materials, but not limited thereto. The material layer 14 may include a pixel defining layer or other required conductive lines and/or insulating materials, but not limited thereto. When the electronic device 101 includes a liquid crystal device, the insulating layer 16 in the pixel substrate 10 may include a liquid crystal material, but not limited thereto. In some embodiments, the third direction D3 may be orthogonal to the first direction D1 and the second direction D2, respectively, and the third direction D3 may be used as the thickness direction of the pixel substrate 10 and/or the thickness direction of the substrate 12, but not limited thereto. In some embodiments, the exposed part of each pixel may be defined as a portion of each pixel without overlapping the first light blocking structure BS1 in the third direction D3. In some embodiments, the first light blocking structure BS1 may be disposed on the insulating layer 16, the first light blocking structure BS1 and the pixels PX may be located at two opposite sides of the insulating layer 16 in the third direction D3, and the first light blocking structure BS1 and the pixels PX are not disposed on the same plane accordingly. In addition, different first ratios may be obtained by adjusting the first pitch P1 and the first length L1 described above, and the distribution of the light emitted from the first pixel PX1 and/or the distribution of the brightness of the first pixel PX1 at different angles relative to the third direction D3 may be modified accordingly. For example, when the first ratio is relatively high, the amount of light emitted from the first pixel PX1 may be greater and/or the brightness of the first pixel PX1 may be higher at a larger angle relative to the third direction D3 (such as an angle greater than or equal to 45 degrees), and that is, the effect of reducing the emitted light and/or the brightness is poor. However, the effect on reducing the emitted light and/or the brightness at the front view and/or at the smaller angles is relatively small. Comparatively, when the first ratio is relatively low, the amount of light emitted from the first pixel PX1 may be smaller and/or the brightness of the first pixel PX1 may be lower at a larger angle relative to the third direction D3 (such as an angle greater than or equal to 45 degrees), and that is, the effect of reducing the emitted light and/or the brightness is great. Therefore, the first ratio may be adjusted according to the requirements of the products. For example, the first ratio may be greater than or equal to 0.4 and less than or equal to 0.85, the first ratio may be greater than or equal to 0.4 and less than or equal to 0.6, the first ratio may be greater than or equal to 0.5 and less than or equal to 0.8, or the first ratio may be within other suitable ranges located between 0.4 and 0.85.

Figure 3:
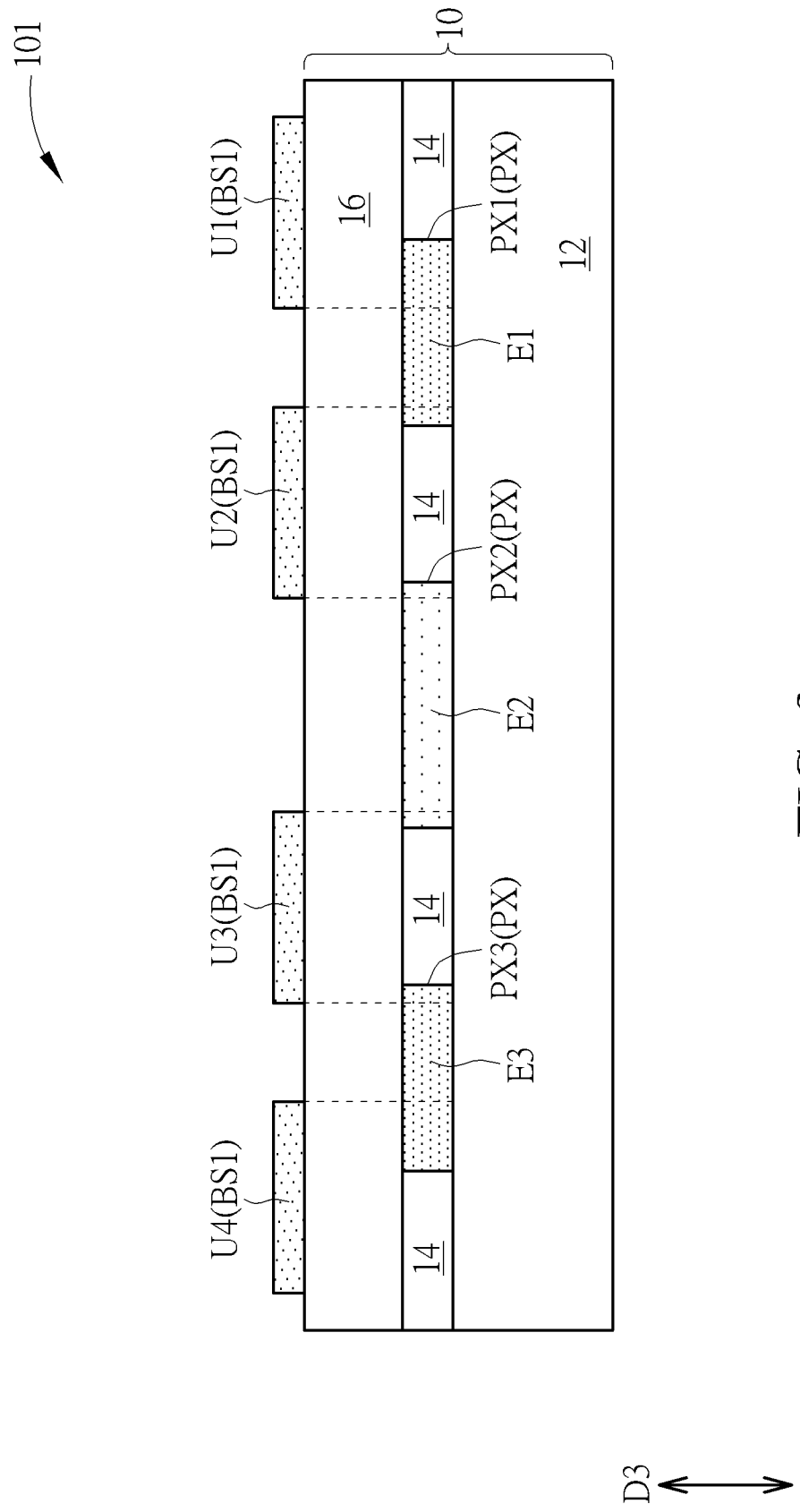
FIG. 3 is a cross-sectional diagram of the electronic device according to the first embodiment of the present disclosure taken along a line B-B' in FIG. 2.

Please refer to FIG. 2 and FIG. 3. FIG. 3 is a cross-sectional diagram of the electronic device according to the first embodiment of the present disclosure taken along a line B-B' in FIG. 2. As shown in FIG. 2 and FIG. 3, the pixel substrate 10 may further include the second pixel PX2, and the first light blocking structure BS1 may further include a third unit U3. The second unit U2 may be disposed between the first unit U1 and the third unit U3, and the second unit U2 and the third unit U3 may be separated from each other in the first direction D1 by a second pitch P2. The second pixel PX2 may have an exposed part E2 located between the second unit U2 and the third unit U3, the exposed part E2 of the second pixel PX2 may have a second length L2 in the first direction D1, a second ratio (for example, R2 may be used to represent the second ratio) is a ratio of the second length L2 to the second pitch P2 (such as L2/P2), a third ratio (for example, R3 may be used to represent the third ratio) is a ratio of the first ratio to the second ratio (such as R1/R2), and the third ratio is greater than or equal to 0.75 and less than or equal to 1.25 (for example, it may be represented by 0.75≤R3≤1.25). In other words, the second ratio may be equal to or different from the first ratio, and the second pitch P2 may be equal to or different from the first pitch P1. In some embodiments, the material composition of the third unit U3 of the first light blocking structure BS1 may be identical to that of the first unit U1 and the second unit U2 of the first light blocking structure BS1, and the third unit U3 may extend in the second direction D2 also. Similarly, the second pitch P2 may be equal to a distance between the left edge of the second unit U2 and the left edge of the third unit U3 in the first direction D1 as illustrated in FIG. 3. In some embodiments, the first unit U1, the second unit U2, and the third unit U3 may have substantially the same width (such as a width W1 illustrated in FIG. 1), and the second pitch P2 may be equal to the sum of the width W1 and the distance DS2 between the second unit U2 and the third unit U3 in the first direction D1, but not limited thereto. In some embodiments, the second ratio may be greater than or equal to 0.4 and less than or equal to 0.85, the second ratio may be greater than or equal to 0.5 and less than or equal to 0.8, the second ratio may be greater than or equal to 0.4 and less than or equal to 0.6, or the second ratio may be within other suitable ranges located between 0.4 and 0.85.

Please refer to FIG. 2. In some embodiments, the first unit U1, the second unit U2, and the third unit U3 may be straight lines when the first unit U1, the second unit U2, and the third unit U3 are viewed in the third direction D3, but not limited thereto. In other embodiments, the first unit U1, the second unit U2, and/or the third unit U3 may be curved, but may extend in the second direction D2 substantially.

In some embodiments, the first pixel PX1 and the second pixel PX2 may emit light of different colors, and the area of the first pixel PX1 (such as a projection area in the third direction D3) may be different from that of the second pixel PX2 under the consideration of the differences in stimulus value of different colors, light emitting efficiency of different colors, and/or color mixing effects. For example, in some embodiments, the area of the first pixel PX1 may be less than the area of the second pixel PX2, the first length L1 of the exposed part E1 of the first pixel PX1 may be less than the second length L2 of the exposed part E2 of the second pixel PX2, and the first pitch P1 may be less than the second pitch P2, but not limited thereto. In some embodiments, a fourth ratio (for example, R4 may be used to represent the fourth ratio) may be a ratio of the first length L1 to the second length L2 (such as L1/L2), and the fourth ratio is greater than or equal to 0.3 and less than or equal to 1 (for example, it may be represented by 0.3≤R4≤1). In other words, the length L1 of the exposed part E1 of the first pixel PX1 may be less than or equal to the second length L2 of the exposed part E2 of the second pixel PX2, but not limited thereto. However, the difference between the first ratio and the second ratio described above should not be too large for avoiding that the difference between the light blocking effect of the first light blocking structure BS1 on the first pixel PX1 and the light blocking effect of the first light blocking structure BS1 on the second pixel is too large to affect the integral display performance of the electronic device. Therefore, the issue described above may be improved by making the third ratio (i.e. the ratio of the first ratio to the second ratio) greater than or equal to 0.75 and less than or equal to 1.25, or making the third ratio greater than or equal to 0.85 and less than or equal to 1.15.

In some embodiments, the pixel substrate 10 may further include a third pixel PX3, and the first light blocking structure BS1 may further include a fourth unit U4. The third unit U3 may be disposed between the second unit U2 and the fourth unit U4, and the third unit U3 and the fourth unit U4 may be separated from each other in the first direction D1 by a third pitch P3. The third pixel PX3 may have an exposed part E3 located between the third unit U3 and the fourth unit U4, and the exposed part E3 of the third pixel PX3 may have a third length L3 in the first direction D1. In some embodiments, a ratio of the third length L3 to the third pitch P3 (such as L3/P3) may be greater than or equal to 0.4 and less than or equal to 0.85, the ratio may be greater than or equal to 0.5 and less than or equal to 0.8, the ratio may be greater than or equal to 0.4 and less than or equal to 0.6, or the ratio may be within other suitable ranges located between 0.4 and 0.85. In some embodiments, a material composition of the fourth unit U4 of the first light blocking structure BS1 may be identical to that of the first unit U1 and the second unit U2 of the first light blocking structure BS1, and the fourth unit U4 may extend in the second direction D2 also. Similarly, the third pitch P3 may be equal to a distance between the left edge of the third unit U3 and the left edge of the fourth unit U4 in the first direction D1 as illustrated in FIG. 3. In some embodiments, the first unit U1, the second unit U2, the third unit U3, and the fourth unit U4 may have substantially the same width (such as a width W1 illustrated in FIG. 1), and the third pitch P3 may be equal to the sum of the width W1 and the distance DS3 between the third unit U3 and the fourth unit U4 in the first direction D1, but not limited thereto.

In some embodiments, the third pixel PX3 and the first pixel PX1 may emit light of the same color, the area of the third pixel PX3 may be substantially equal to the area of the first pixel, and the third length L3 of the exposed part E3 of the third pixel PX3 may be substantially equal to the length L1 of the exposed part E1 of the first pixel PX1. In some embodiments, the ratio of the third length L3 to the third pitch P3 may be substantially equal to the first ratio described above, but not limited thereto.

In some embodiments, the pixel substrate 10 may further include a fourth pixel PX4, and the fourth pixel PX4 may have an exposed part E4 located between the second unit U2 and the third unit U3. In some embodiments, the fourth pixel PX4 and the second pixel PX2 may emit light of different colors, and an area of the fourth pixel PX4 may be substantially equal to or different from that of the second pixel PX2. In some embodiments, a length of the exposed part E4 of the fourth pixel PX4 in the first direction D1 may be substantially equal to the second length L2 described above, and a ratio of the length of the exposed part E4 of the fourth pixel PX4 in the first direction D1 to the second pitch P2 may be substantially equal to the second ratio described above accordingly, but not limited thereto. In some embodiments, the first pixel PX1, the second pixel PX2, and the fourth pixel PX4 may emit light of different colors (such as emitting green light, blue light, and red light, respectively), and the first pixel PX1 and the third pixel PX3 may emit light of the same color, but not limited thereto.

As shown in FIG. 1, in some embodiments, a thickness TK1 of the first unit U1 of the first light blocking structure BS1 may be less than the width W1 of the first unit U1 for reducing the influence of the first light blocking structure BS1 on the surface flatness. For example, a fifth ratio (for example, R5 may be used to represent the fifth ratio) may be a ratio of the thickness TK1 of the first unit U1 to the width W1 of the first unit U1 (such as TK1/W1), and the fifth ratio may be greater than or equal to 0.01 and less than or equal to 0.5 (for example, it may be represented by 0.01≤R5≤0.5) for reducing the influence of the first light blocking structure BS1 on the surface flatness under the situation where a certain thickness may be maintained to provide the desired light blocking effect. Additionally, in some embodiments, the units in the first light blocking structure BS1 may have substantially the same thickness and/or substantially the same width, but not limited thereto.

It is worth noting that the shape of each pixel PX of the present disclosure in the top view is not limited to the shape illustrated in FIG. 2, and the pixel PX with other suitable shapes may also be applied according to other design considerations. As shown in FIGS. 1-3, in some embodiments, the length of each exposed part described above in the first direction D1 may include the maximum length of each exposed part in the first direction D1, and each length may be a result measured along the first direction D1 in the top view diagram (such as FIG. 2). The first length L1 of the exposed part E1 of the first pixel PX1 may be the maximum length of the exposed part E1 in the first direction D1, the second length L2 of the exposed part E2 of the second pixel PX2 may be the maximum length of the exposed part E2 in the first direction D1, and the third length L3 of the exposed part E3 of the third pixel PX3 may be the maximum length of the exposed part E3 in the first direction D1. In some embodiments, the first unit U1, the second unit U2, the third unit U3, and the fourth unit U4 of the first light blocking structure BS1 may be disposed separated from one another at the region adjacent to each pixel PX. The first unit U1, the second unit U2, the third unit U3, and the fourth unit U4 are not connected with one another by other portion of the first light blocking structure BS1, and the first light blocking structure BS1 may be used to adjust the amount of emitted light and/or the brightness at angles relative to the third direction D3 with relatively little influence on the display condition of the emitted light and/or the brightness in the second direction D2. In some embodiments, when the electronic device 101 is applied to a car display device, the third direction D3 may be the viewing direction of the user viewing the electronic device 101, the first direction D1 may be the vertical direction when the user views the electronic device 101, and the second direction may be the horizontal direction. When the electronic device 101 is disposed underneath the windshield, the first light blocking structure BS1 extends in the second direction D2 for adjusting the amount of emitted light and/or the brightness of each pixel PX at angles relative to the third direction D3, and lowering the amount of emitted light and/or the brightness of the electronic device 101 at large angles. Accordingly, the phenomenon that the electronic device 101 generates more reflections on the windshield may be improved, and the related driving safety problems derived from this may be reduced. However, the electronic device in the present disclosure is not limited to the application described above, and the extending design and the arrangement of the units in the light blocking structure may be further modified according to the product specifications.

Figure 4:
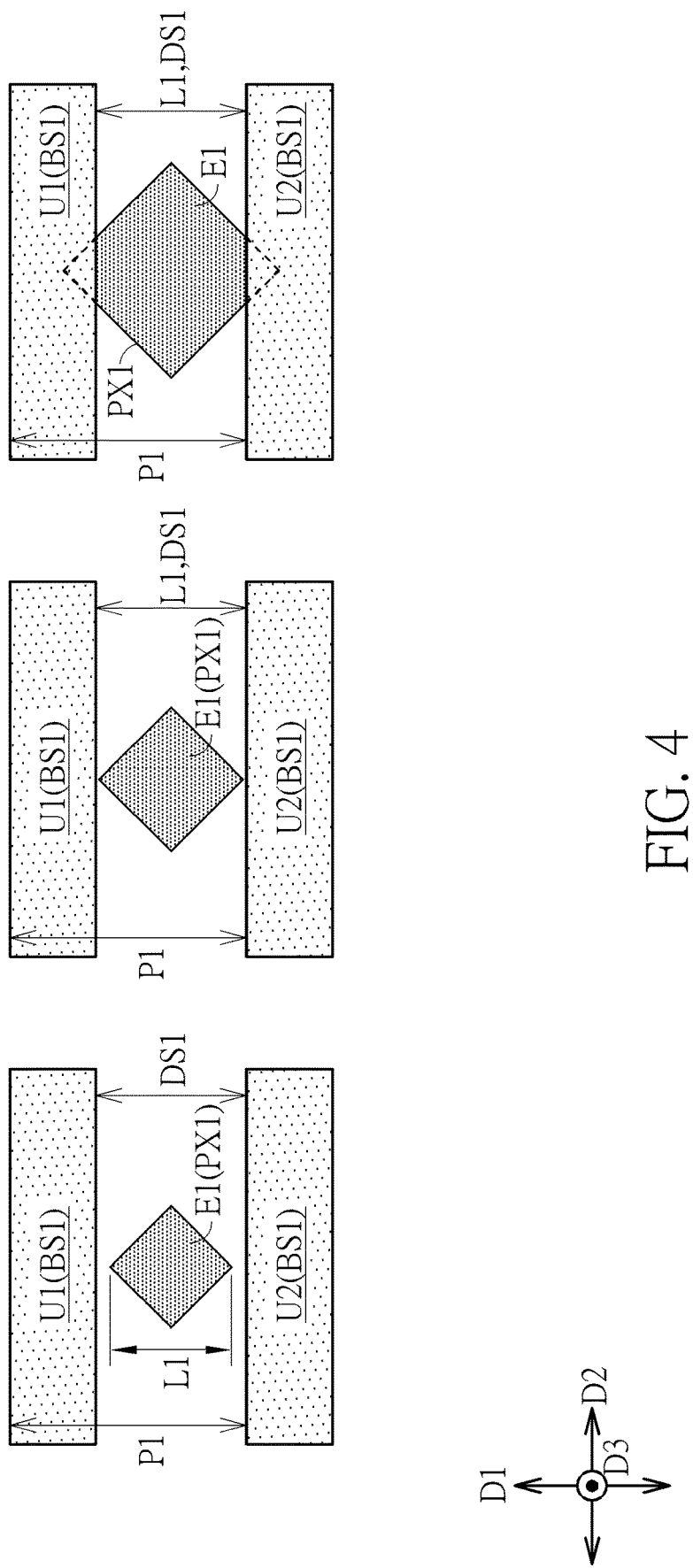
FIG. 4 is a schematic diagram illustrating a disposition of a first pixel and a first light blocking structure in an electronic device according to some embodiments of the present disclosure.

Please refer to FIG. 4 and FIG. 2. FIG. 4 is a schematic diagram illustrating a disposition of the first pixel PX1 and the first light blocking structure BS1 in the electronic device according to some embodiments of the present disclosure. As shown in FIG. 4 and FIG. 2, in some embodiments, the areas of the pixels PX may be modified according to some design considerations for meeting the product requirements. For example, in some embodiments, the first pixel PX1 may partially overlap the first unit U1 and/or the second unit U2 of the first light blocking structure BS1 in the third direction D3, the projection area of the first pixel PX1 in the third direction D3 may be greater than the projection area of the exposed part E1 of the first pixel PX1 in the third direction D3 (such as the condition shown in the right portion of FIG. 2 and FIG. 4), and the first length L1 of the exposed part E1 of the first pixel PX1 in the first direction D1 may be equal to the distance DS1 between the first unit U1 and the second unit U2 in the first direction D1. In some embodiments, as shown in the middle portion of FIG. 4, the first pixel PX1 may not overlap the first light blocking structure BS1 in the third direction D3, and the projection area of the first pixel PX1 in the third direction D3 may be equal to the projection area of the exposed part E1 of the first pixel PX1 in the third direction D3 accordingly. In addition, the first pixel PX1 may adjoin the first light blocking structure BS1, the edges of the first pixel PX1 may be aligned with the edge of the first unit U1 of the first light blocking structure BS1 and the edge of the second unit U2 of the first light blocking structure BS1, respectively, and the first length L1 of the exposed part E1 of the first pixel PX1 in the first direction D1 may be substantially equal to the distance DS1 between the first unit U1 and the second unit U2 in the first direction D1. In some embodiments, as shown in the left portion of FIG. 4, the first pixel PX1 may not overlap the first light blocking structure BS1 in the third direction D3, and the edges of the first pixel PX1 may not be aligned with the edges of the first unit U1 and the second unit U2 of the first light blocking structure BS1. Therefore, the projection area of the first pixel PX1 in the third direction D3 may be equal to the projection area of the exposed part E1 of the first pixel PX1 in the third direction D3, and the first length L1 of the exposed part E1 of the first pixel PX1 in the first direction D1 may be less than the distance DS1 between the first unit U1 and the second unit U2 in the first direction D1. It is worth noting that the different conditions illustrated in FIG. 4 may still comply with the design range of the first ratio described above. In other words, the first ratio may be greater than or equal to 0.4 and less than or equal to 0.85, the first ratio may be greater than or equal to 0.5 and less than or equal to 0.8, the first ratio may be greater than or equal to 0.4 and less than or equal to 0.6, or the first ratio may be within other suitable ranges located between 0.4 and 0.85 for enabling the electronic device 101 to have the desired display effect. Additionally, in some embodiments, the different arrangements illustrated in FIG. 4 may also be applied to the second pixel PX2, the third pixel PX3, and/or the fourth pixel PX4 shown in FIG. 2 described above according to some design considerations.

The electronic device of the present disclosure is not limited to the above-mentioned embodiments and may have different embodiments. In order to simplify the description, the different embodiments below use the same reference numerals to denote the same elements as the above-mentioned embodiments. In order to clearly illustrate the different embodiments, the following description focuses on differences between the embodiments, and same parts will not be repeated again.

Figure 5:
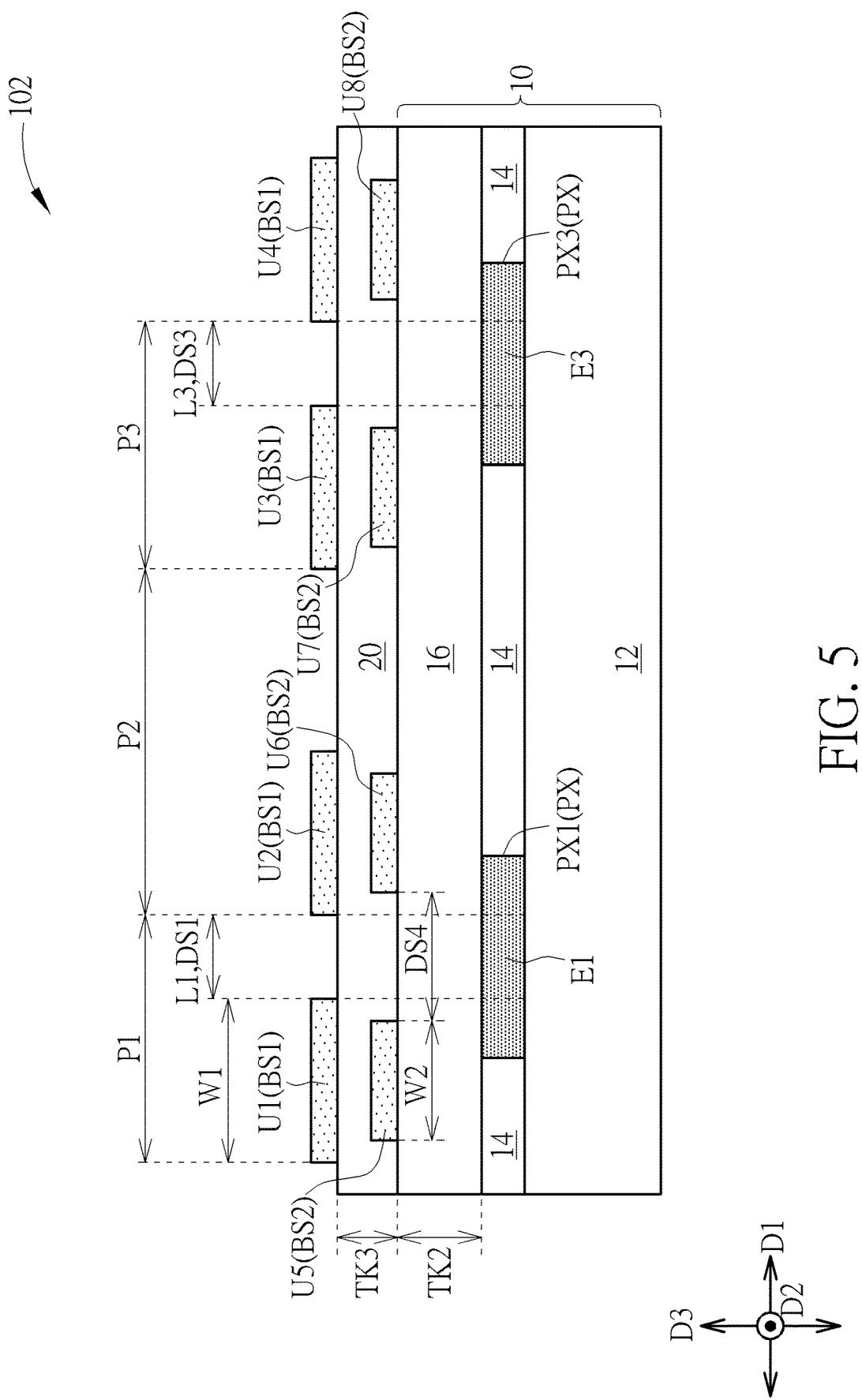
FIG. 5 is a schematic diagram illustrating a partial structure of an electronic device according to a second embodiment of the present disclosure.

Please refer to FIG. 5. FIG. 5 is a schematic diagram illustrating a partial structure of an electronic device 102 according to a second embodiment of the present disclosure. As shown in FIG. 5, the structure of the electronic device 102 is similar to that illustrated in FIG. 1, and the difference between the electronic device 102 and the electronic device 101 is that the electronic device 102 further includes a second light blocking structure BS2 and an insulating layer 20. The second light blocking structure BS2 may be disposed between the first light blocking structure BS1 and the pixel substrate 10, and the insulating layer 20 may be disposed between the first light blocking structure BS1 and the second light blocking structure BS2. In some embodiments, the insulating layer 20 may be used to increase the distance between the first light blocking structure BS1 and the pixel PX, the range of light emitting angle of the pixel PX may be further adjusted with less influence on the display condition of the pixel PX in the front view accordingly, and the second light blocking structure BS2 may be used to enhance the light blocking effect when defects are generated in the first light blocking structure BS1 because of process variations (such as position shift, etc.) and affect the light blocking effect, for example, but not limited thereto. In some embodiments, the second light blocking structure BS2 may include a fifth unit U5, the fifth unit U5 may at least partially overlap the first unit U1 (such as overlapping in the third direction D3), and a width W2 of the fifth unit U5 may be less than the width W1 of the first unit U1 for improving the influence on the display effect of the electronic device when alignment shifts between the first light blocking structure BS1 and the second light blocking structure BS2 occur and affect the overall light blocking effect. In the present disclosure, the width of each unit in the light blocking structure may be a length of each unit measured along the first direction D1.

In some embodiments, the second light blocking structure BS2 may further include a sixth unit U6, the sixth unit U6 may at least partially overlap the second unit U2 in the third direction D3, and a width of the sixth unit U6 may be less than the width of the second unit U2. Therefore, a distance DS4 between the fifth unit U5 and the sixth unit U6 may be greater than the distance DS1 between the first unit U1 and the second unit U2, but not limited thereto. In some embodiments, the second light blocking structure BS2 may further include a seventh unit U7 and an eighth U8 unit disposed corresponding to and at least partially overlapping the third unit U3 and the fourth unit U4 of the first light blocking structure BS1, respectively. The fifth unit U5, the sixth unit U6, the seventh unit U7, and the eighth unit U8 of the second light blocking structure BS2 may have substantially the same width, the width of the seventh unit U7 may be less than that of the third unit U3, and the width of the eighth unit U8 may be less than that of the fourth unit U4 accordingly. In some embodiments, the material of the second light blocking structure BS2 may be similar to that of the first light blocking structure BS1, and the second light blocking structure BS2 may be composed of the units made of light blocking materials without other parts made of transparent materials (such as insulating layers in the electronic device), but not limited thereto. In some embodiments, the fifth unit U5, the sixth unit U6, the seventh unit U7, and the eighth unit U8 of the second light blocking structure BS2 may respectively extend in the second direction D2 and may be disposed separated from one another at the region adjacent to each pixel PX without being connected with one another directly. The fifth unit U5, the sixth unit U6, the seventh unit U7, and the eighth unit U8 are not connected with one another by other portion of the second light blocking structure BS2. In some embodiments, a thickness TK3 of the insulating layer 20 may be less than a thickness TK2 of the insulating layer 16 in the pixel substrate 10 for lowering the interference with the emitted light and/or the brightness between adjacent pixels PX when the gap between the second light blocking structure BS2 and the first light blocking structure BS1 is too large. In addition, the material composition of the insulating layer 20 may be identical to or different from that of the insulating layer 16 according to some design considerations. For example, the material composition of the insulating layer 16 may be different from that of the insulating layer 20 for making the insulating layer 16 having better ability to block water vapor and/or oxygen than the insulating layer 20, but not limited thereto.

Figure 6A:
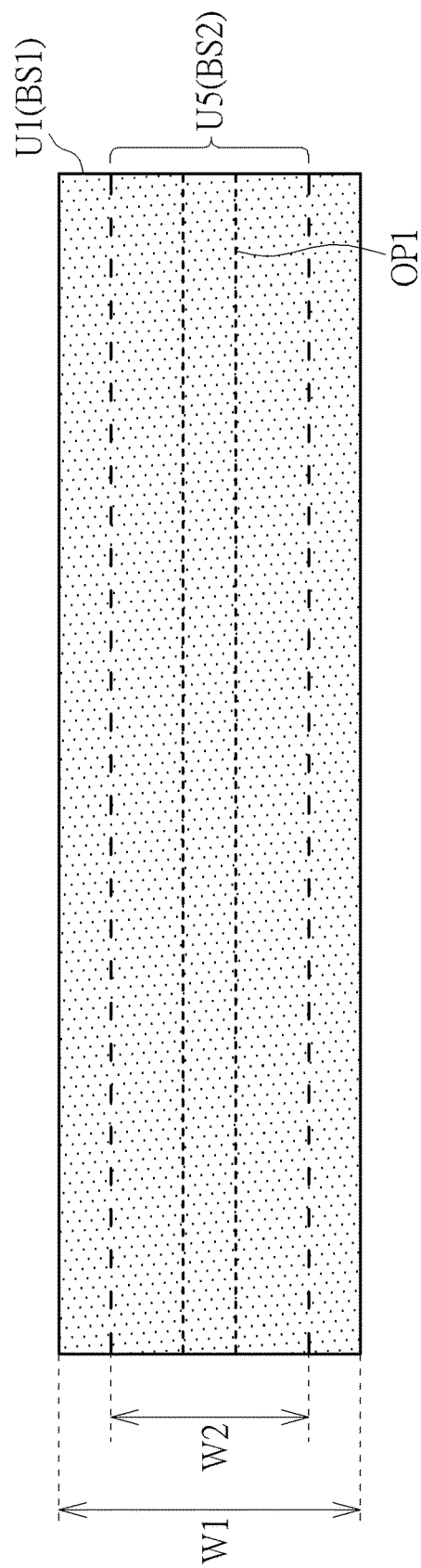
FIG. 6A is a schematic diagram illustrating a partial top view structure of a first light blocking structure and a second light blocking structure in an electronic device according to a third embodiment of the present disclosure.
Figure 6A:
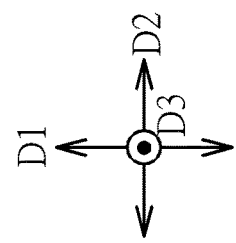
Figure 6B:
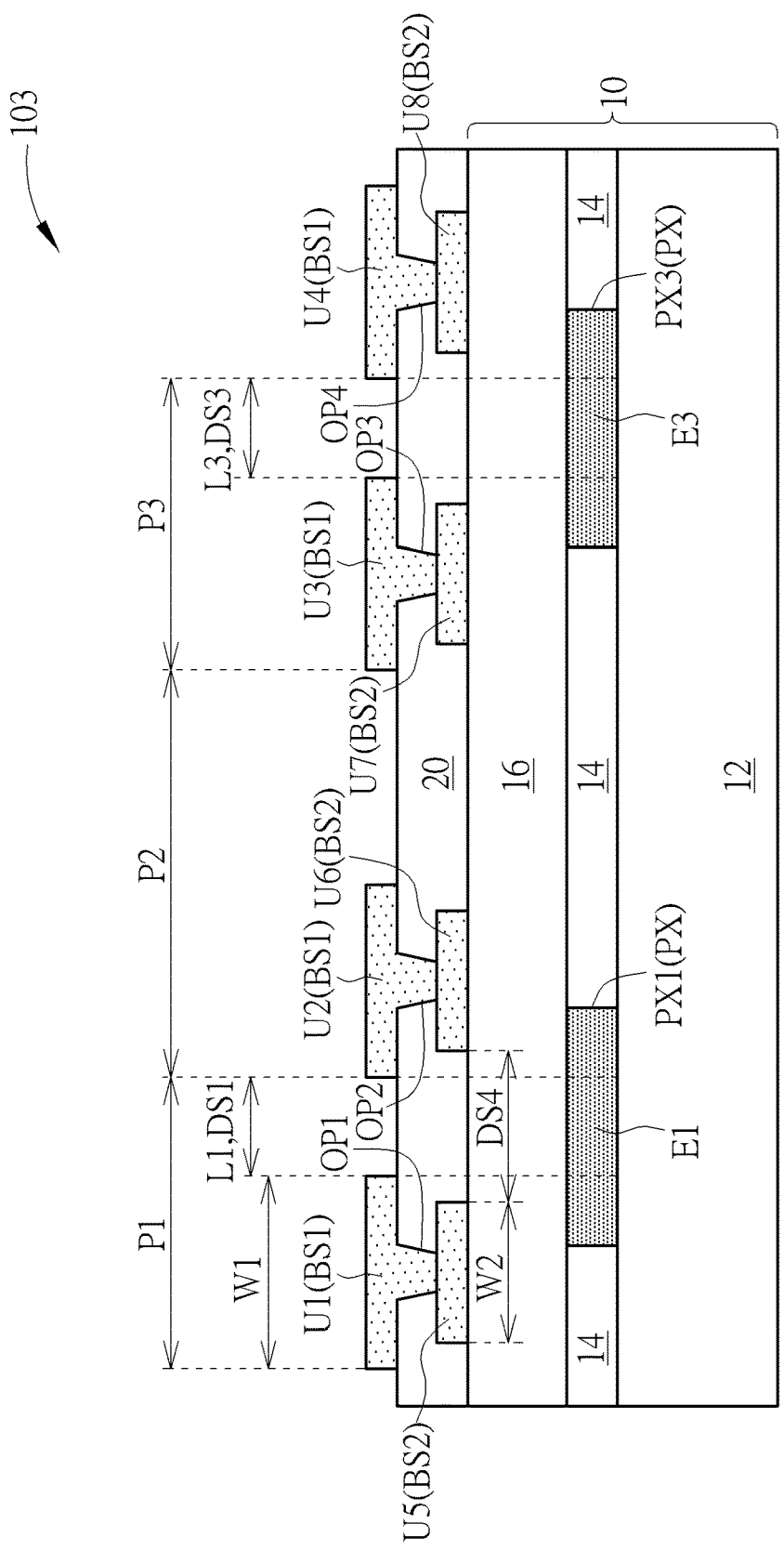
FIG. 6B is a schematic diagram illustrating a partial structure of the electronic device according to the third embodiment of the present disclosure.

Please refer to FIG. 6A and FIG. 6B. FIG. 6A is a schematic diagram illustrating a partial top view structure of the first light blocking structure and the second light blocking structure in an electronic device according to a third embodiment of the present disclosure, and FIG. 6B is a schematic diagram illustrating a partial structure of the electronic device according to the third embodiment of the present disclosure. As shown in FIG. 6A and FIG. 6B, in an electronic device 103, the insulating layer 20 may include a plurality of openings disposed corresponding to the units of the second light blocking structure BS2, respectively, and the units of the first light blocking structure BS1 may contact the units of the second light blocking structure BS2 through the corresponding openings in the insulating layer 20. For example, the insulating layer 20 may include an opening OP1, an opening OP2, an opening OP3, and an opening OP4 disposed corresponding to the fifth unit U5, the sixth unit U6, the seventh unit U7, and the eighth unit U8 of the second light blocking structure BS2, respectively, and each opening may extend in the second direction D2. The first unit U1 may be partly disposed in the opening OP1 and contact the fifth unit U5 through the opening OP1, the second unit U2 may be partly disposed in the opening OP2 and contact the sixth unit U6 through the opening OP2, the third unit U3 may be partly disposed in the opening OP3 and contact the seventh unit U7 through the opening OP3, and the fourth unit U4 may be partly disposed in the opening OP4 and contact the eighth unit U8 through the opening OP4. The interference with the emitted light and/or the brightness between adjacent pixels PX may be further reduced by the design where the first light blocking structure BS1 is partly disposed in the openings, and the display effect of the electronic device 103 may be improved.

To summarize the above descriptions, in the electronic device according to the present disclosure, the light blocking structure may be disposed on the pixel substrate, and the relative relationship between the length of the exposed part of the pixel and the arrangement pitch of the corresponding light blocking structure may be controlled for lowering the display brightness at large angles and meeting specific product requirements.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
    a pixel substrate comprising a first pixel and a second pixel, wherein an area of the first pixel is less than an area of the second pixel; and
    a first light blocking structure disposed on the pixel substrate and comprising a first unit, a second unit, and a third unit,
    wherein in a top view direction of the electronic device, the first unit and the second unit are separated from each other in a first direction by a first pitch, the first pixel has an exposed part between the first unit and the second unit, the exposed part has a first length in the first direction, a first ratio is a ratio of the first length to the first pitch, and the first ratio is greater than or equal to 0.4 and less than or equal to 0.85,
    wherein the second unit is disposed between the first unit and the third unit, the second unit and the third unit are separated from each other in the first direction by a second pitch, the second pixel has an exposed part between the second unit and the third unit, the exposed part of the second pixel has a second length in the first direction, a second ratio is a ratio of the second length to the second pitch, a third ratio is a ratio of the first ratio to the second ratio, and the third ratio is greater than or equal to 0.75 and less than or equal to 1.25,
    wherein the first length is less than the second length.

2. The electronic device according to claim 1, wherein the first ratio is greater than or equal to 0.5 and less than or equal to 0.8.

3. The electronic device according to claim 1, wherein the third ratio is greater than or equal to 0.85 and less than or equal to 1.15.

4. The electronic device according to claim 1, wherein a fourth ratio is a ratio of the first length to the second length, and the fourth ratio is greater than or equal to 0.3 and less than.

5. The electronic device according to claim 1, wherein the pixel substrate further comprises a third pixel, an area of the third pixel is substantially equal to an area of the first pixel, the first light blocking structure further comprises a fourth unit, the third unit is disposed between the second unit and the fourth unit, the third pixel has an exposed part between the third unit and the fourth unit, the exposed part of the third pixel has a third length in the first direction, and the third length is substantially equal to the first length.

6. The electronic device according to claim 1, wherein a thickness of the first unit is less than a width of the first unit.

7. The electronic device according to claim 6, wherein a fifth ratio is a ratio of the thickness of the first unit to the width of the first unit, and the fifth ratio is greater than or equal to 0.01 and less than or equal to 0.5.

8. The electronic device according to claim 1, further comprising:
    a second light blocking structure disposed between the first light blocking structure and the pixel substrate, wherein the second light blocking structure comprises a fifth unit overlapping the first unit, and a width of the fifth unit is less than a width of the first unit.

9. The electronic device according to claim 1, further comprising:
    a second light blocking structure disposed between the first light blocking structure and the pixel substrate, wherein the second light blocking structure comprises a fifth unit overlapping the first unit and a sixth unit overlapping the second unit, and a second distance between the fifth unit and the sixth unit is greater than a first distance between the first unit and the second unit.

10. The electronic device according to claim 1, further comprising:
    an insulating layer and a second light blocking structure, wherein the second light blocking structure is disposed between the first light blocking structure and the pixel substrate, the insulating layer is disposed between the first light blocking structure and the second light blocking structure, and the first light blocking structure contacts the second light blocking structure through an opening of the insulating layer.

11. The electronic device according to claim 1, further comprising:
    a first insulating layer and a second light blocking structure, wherein the second light blocking structure is disposed between the first light blocking structure and the pixel substrate, and the first insulating layer is disposed between the first light blocking structure and the second light blocking structure, wherein the pixel substrate further comprises a second insulating layer disposed on the first pixel, and a thickness of the first insulating layer is less than a thickness of the second insulating layer.

12. The electronic device according to claim 1, wherein the first pixel comprises an organic light emitting diode.

* * * * *